United States Patent
Purohit

(10) Patent No.: US 8,228,658 B2
(45) Date of Patent: Jul. 24, 2012

(54) VARIABLE FREQUENCY ELECTROSTATIC CLAMPING

(75) Inventor: Ashwin M. Purohit, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 885 days.

(21) Appl. No.: 11/704,033

(22) Filed: Feb. 8, 2007

(65) Prior Publication Data

US 2008/0192405 A1    Aug. 14, 2008

(51) Int. Cl.
*H01L 21/683* (2006.01)
(52) U.S. Cl. ....................................................... 361/234
(58) Field of Classification Search .................. 361/234
See application file for complete search history.

(56) References Cited

U.S. PATENT DOCUMENTS

| | | | |
|---|---|---|---|
| 5,452,177 A | 9/1995 | Frutiger | |
| 6,388,861 B1 | 5/2002 | Frutiger | |
| 2004/0097058 A1* | 5/2004 | Purser et al. | 438/514 |
| 2007/0195482 A1* | 8/2007 | Muka et al. | 361/234 |
| 2008/0180873 A1* | 7/2008 | Boyd et al. | 361/234 |

FOREIGN PATENT DOCUMENTS

GB    2200807 A   *   8/1988

\* cited by examiner

*Primary Examiner* — Rexford Barnie
*Assistant Examiner* — Ann Hoang
(74) *Attorney, Agent, or Firm* — Eschweiler & Associates, LLC

(57) ABSTRACT

A method for clamping a workpiece involves placing the workpiece on a clamping surface of an electrostatic clamp. A clamping voltage is applied to the electrostatic clamp at a first frequency, therein providing a first clamping force between the workpiece and the electrostatic clamp. The application of clamping voltage at the first frequency is halted and another clamping voltage at a second frequency is applied to the electrostatic clamp, therein providing a second clamping force between the workpiece and the electrostatic clamp. The second frequency is greater than the first frequency, wherein the second clamping force is less than the first clamping force. The application of the clamping voltage at the second frequency is then halted, and the workpiece is removed from the electrostatic clamp. The clamping voltage can be controlled based on a set of performance criteria, such as a desired minimum clamping force and a maximum de-clamp time.

6 Claims, 2 Drawing Sheets

VARIABLE FREQUENCY ELECTROSTATIC CLAMPING

FIELD OF THE INVENTION

The present invention relates generally to workpiece processing systems and methods for processing workpieces, and more specifically to a method for electrostatically clamping workpieces using a variable frequency voltage waveform.

BACKGROUND OF THE INVENTION

Electrostatic clamps or chucks (ESCs) are commonly implemented to hold workpieces in plasma-based or vacuum-based semiconductor processes such as etching, CVD, and ion implantation, etc. Capabilities of the ESCs, including non-edge exclusion and workpiece temperature control, have proven to be quite valuable in processing semiconductor substrates, such as silicon wafers. A typical ESC, for example, comprises a dielectric layer positioned over a conductive electrode, wherein the semiconductor wafer or workpiece is placed on a surface of the ESC (e.g., the workpiece is placed on a surface of the dielectric layer). During semiconductor processing (e.g., ion implantation), a clamping voltage is typically applied between the workpiece and the electrode, wherein the workpiece is clamped against the chuck surface by electrostatic forces.

De-clamping or un-sticking the workpiece from the chuck surface, however, is a concern in many ESC applications. For example, after the clamping voltage is turned off, the workpiece typically "sticks" to the chuck surface for a considerable amount of time, wherein the workpiece cannot be removed by typical workpiece lifting mechanisms (e.g., pins extending through the ESC which are operable to lift the workpiece from the surface of the dielectric layer). This workpiece de-clamping problem can reduce the throughput of the process. It is believed that the de-clamping problem occurs when residual charges induced by the clamping voltage remain on the dielectric layer or on a surface of the workpiece, therein leading to an undesirable electric field and clamping force. According to a charge migration model, residual charges are caused by charge migration and accumulation during clamping, wherein the charges accumulate at the dielectric surface and/or workpiece backside (e.g., when the workpiece surface comprises an insulating layer).

An RC time constant, for example, can be used to characterize the charge/discharge times which correspond to an amount of time typically required to respectively clamp or de-clamp the workpiece. Conventionally, this time constant is determined by the product of a volume resistance of the dielectric layer and a gap capacitance between the wafer and dielectric surfaces, i.e., $$RC = R_{die} C_{gap} = \rho(\text{dielectric})\varepsilon_0 \varepsilon_r \frac{d(\text{dielectric})}{gap} \quad (1)$$

where $R_{die}$ is the resistance of the dielectric layer, $C_{gap}$ is the capacitance of the gap between the wafer and the chuck surface, $\rho(\text{dielectric})$ is the volume resistivity of the dielectric layer, $\varepsilon_0$ is the free space permittivity, $\varepsilon_r$ is the dielectric constant of the gap, $d(\text{dielectric})$ is the thickness of the dielectric layer, and gap is the distance between the dielectric and workpiece surfaces. Thus, depending on the dielectric chosen, the gap, and other factors, the clamping and de-clamping times can be significantly long. A variety of techniques have been conventionally used for reducing workpiece de-clamping problems encountered in the use of ESCs. For example, one conventional technique involves applying a reversal voltage before the workpiece is removed from the ESC, therein eliminating a residual attractive force. This reversal voltage, however, is typically 1.5 to 2 times higher than the clamping voltage, and the de-clamping time is still typically quite large.

Another conventional technique involves providing a low-frequency sinusoidal or square-wave AC voltages to one or more electrodes in order to produce wave fields of a specified amplitude and phase. In utilizing an AC clamping voltage, the voltage applied to the ESC oscillates between positive and negative voltage, thus passing through zero volts during the oscillation. When passing through zero volts, the clamping force applied to the workpiece is diminished, and a deleterious vibration or "fluttering" of the workpiece with respect to the ESC can be observed, wherein the workpiece can potentially separate from the ESC. In order to alleviate some of the vibration, low frequencies of the AC voltages have been utilized, wherein residual attractive forces maintain clamping during the passage through zero volts.

Conventionally, a fixed, low frequency of the AC clamping voltage is selected such that sufficient clamping force is achieved during both processing and handling of the workpiece. During de-clamping of the workpiece, however, there still exist substantial residual clamping forces caused by the RC time constant and the low frequency AC clamping voltage. Therefore, a need exists in the art for a method for optimizing electrostatic clamping of a workpiece to an ESC, while further minimizing an amount of time needed to de-clamp the workpiece.

SUMMARY OF THE INVENTION

The present invention overcomes the limitations of the prior art by providing a method for optimally controlling a clamping of an electrostatic clamp by controlling a frequency of a clamping voltage applied thereto. More particularly, the present invention provides a method for optimally clamping and de-clamping workpieces, wherein a de-clamping time after processing of the workpiece is generally minimized. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a method for electrostatically clamping and de-clamping a workpiece with respect to an AC-driven electrostatic clamp or chuck. The method comprises providing a clamping system comprising an electrostatic clamp and a power source, wherein the electrostatic clamp comprises a clamping plate having a clamping surface associated therewith. The clamping plate, for example, comprises one or more electrodes, therein generally defining one or more poles of the electrostatic clamp. For example, the electrostatic clamp may comprise a multi-polar electrostatic clamp, such as a bi-polar or tri-polar clamp. The clamping plate further has an RC time constant associated therewith.

In accordance with one exemplary aspect of the invention, the method comprises placing the workpiece on the clamping surface of the clamping plate, and applying an AC clamping voltage at a first frequency to the one or more electrodes of the clamping plate. The AC clamping voltage applied at the first frequency therein provides a first clamping force between the workpiece and the electrostatic clamp. Concurrent to the application of the AC clamping voltage at the first frequency, the workpiece may be translated through a process medium, such as an ion beam. The translation, for example, can be a reciprocal translation in one or more dimensions, wherein significant G-forces are present at a reversal of direction of the translation.

In accordance with the present invention, the application of the AC clamping voltage at the first frequency is halted, and another AC clamping voltage at a second frequency is applied to the one or more electrodes of the clamping plate, wherein the second frequency is not equal to the first frequency. Thus, a second clamping force is provided between the workpiece and the electrostatic clamp via the application of the AC clamping voltage at the second frequency. The second frequency, for example, is greater than the first frequency, wherein the AC clamping voltage at the second frequency thus provides the second clamping force as being less than the first clamping force. In one example, the application of the AC clamping voltage at the first frequency is halted and the AC clamping voltage at the second frequency is applied concurrent with or during the translation of the electrostatic clamp. The application of the AC clamping voltage at the second frequency is further halted, the workpiece is removed from the electrostatic clamp.

Accordingly, the clamping voltage at the first frequency generally maintains a position of the workpiece with respect to the clamping surface throughout the translation, and the clamping voltage at the second, higher frequency generally permits an expedient removal of the workpiece from the clamping plate.

In accordance with another exemplary aspect of the invention, the first frequency and second frequency are further controlled, based, at least in part, on a set of performance criteria. The set of performance criteria, for example, comprises a desired minimum clamping force between the workpiece and the clamping plate, such as the desired minimum clamping force during the translation, and a maximum de-clamp time.

The electrostatic clamp may comprise a multi-polar electrostatic clamp having a plurality of electrodes, wherein the plurality of electrodes generally define a plurality of poles. The applications of the AC clamping voltage at the first frequency and the second frequency, for example, are further applied to the plurality of poles, wherein a phase of the AC clamping voltage applied to each pole is offset by a phase shift from the remainder of the plurality of poles.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
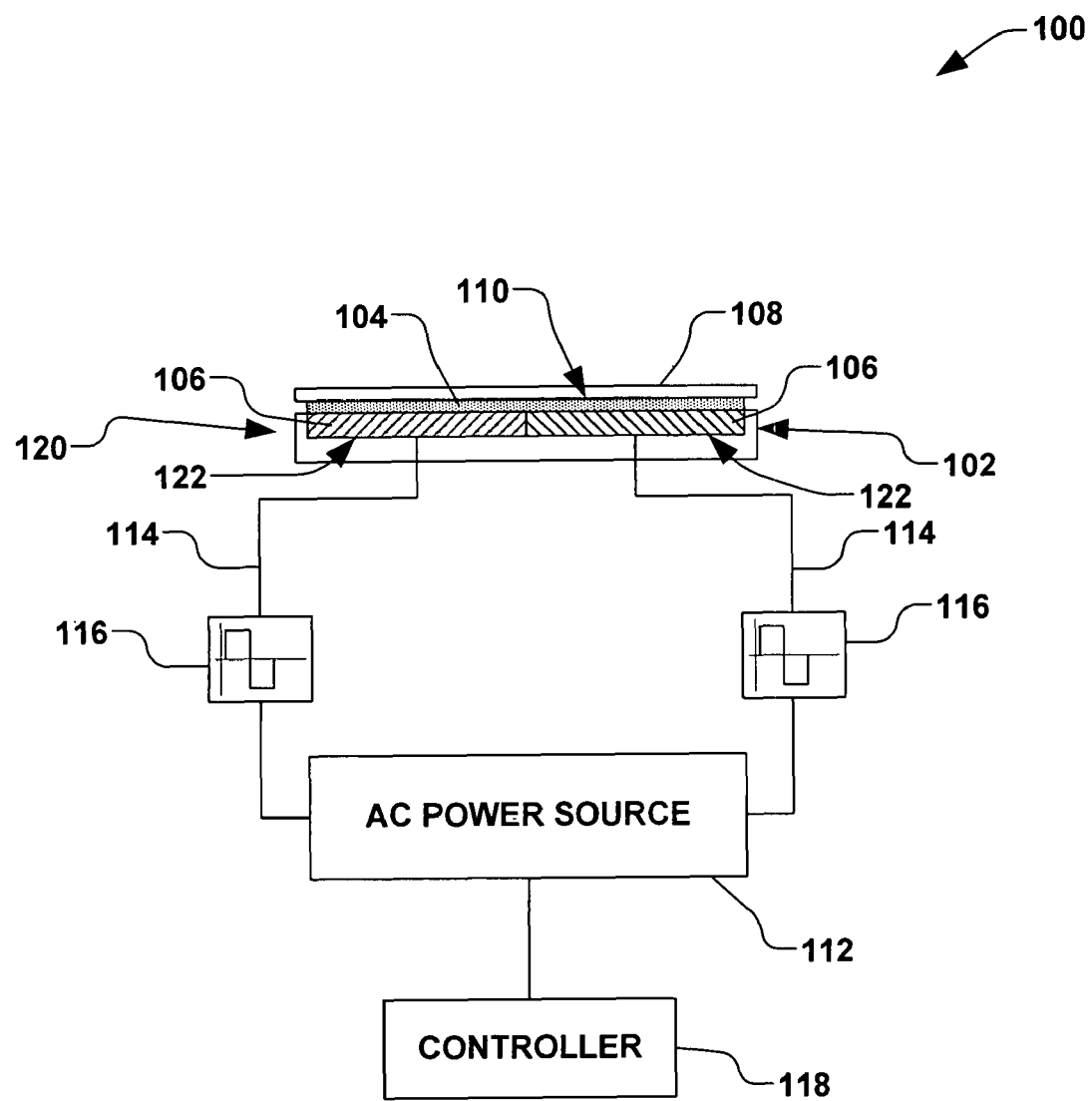
FIG. 1 is a block diagram of an exemplary electrostatic clamping system in accordance with one aspect of the present invention.

The present invention is directed generally toward a method for clamping workpieces to an electrostatic clamp or chuck, and more particularly, to a method for providing a desired clamping force to the workpiece while also providing a minimal de-clamp time. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in order to gain a better understanding of the invention, FIG. 1 illustrates an exemplary electrostatic clamping system 100, wherein several inventive aspects of the present invention will now be described. The electrostatic clamping system 100, for example, comprises an electrostatic clamp (ESC) 102, wherein the electrostatic clamp comprises a clamping plate 104 having one or more clamping electrodes 106 associated therewith. The clamping plate 104, for example, is comprised of a dielectric material. The ESC 102 is configured to electrostatically attract a workpiece 108 to a surface 110 of the clamping plate 104 via electrostatic forces induced between the ESC and the workpiece. In the present example, each clamping electrode 106 is electrically connected to an AC power source 112 via one or more electrical connections 114, wherein the AC power source is operable to provide one or more variable-frequency AC clamping voltage waveforms or phases 116 to the one or more clamping electrodes 106. The electrostatic clamping system 100 further comprises a controller 118 configured to control the AC power source 110, such as a frequency of the AC clamping voltage waveforms 116, as will be described infra. It should be noted that the AC power source 110 can comprise a plurality of power supplies (not shown) configured to provide the one or more AC clamping voltage waveforms 116.

The one or more clamping electrodes 106 of the ESC 102 of FIG. 1 may be arranged in any number of different manners. The ESC 102, for example, may alternatively comprise a multi-polar electrostatic clamp 120 having a plurality of electrodes 106, wherein the plurality of electrodes generally define a plurality of poles 122. Each of the AC clamping voltage waveforms 116 applied to the plurality of poles 122 can thus be offset by a phase shift from the remainder of the plurality of waveforms, as will be understood by one of ordinary skill in the art. Alternatively, the ESC 102 may comprise a single electrode 106, therein defining a single pole electrostatic clamp (not shown). Thus, it should be noted that the present invention contemplates any number of clamping electrodes 106, wherein each of the clamping electrodes are electrically connected to the AC power source 112.

Figure 2:
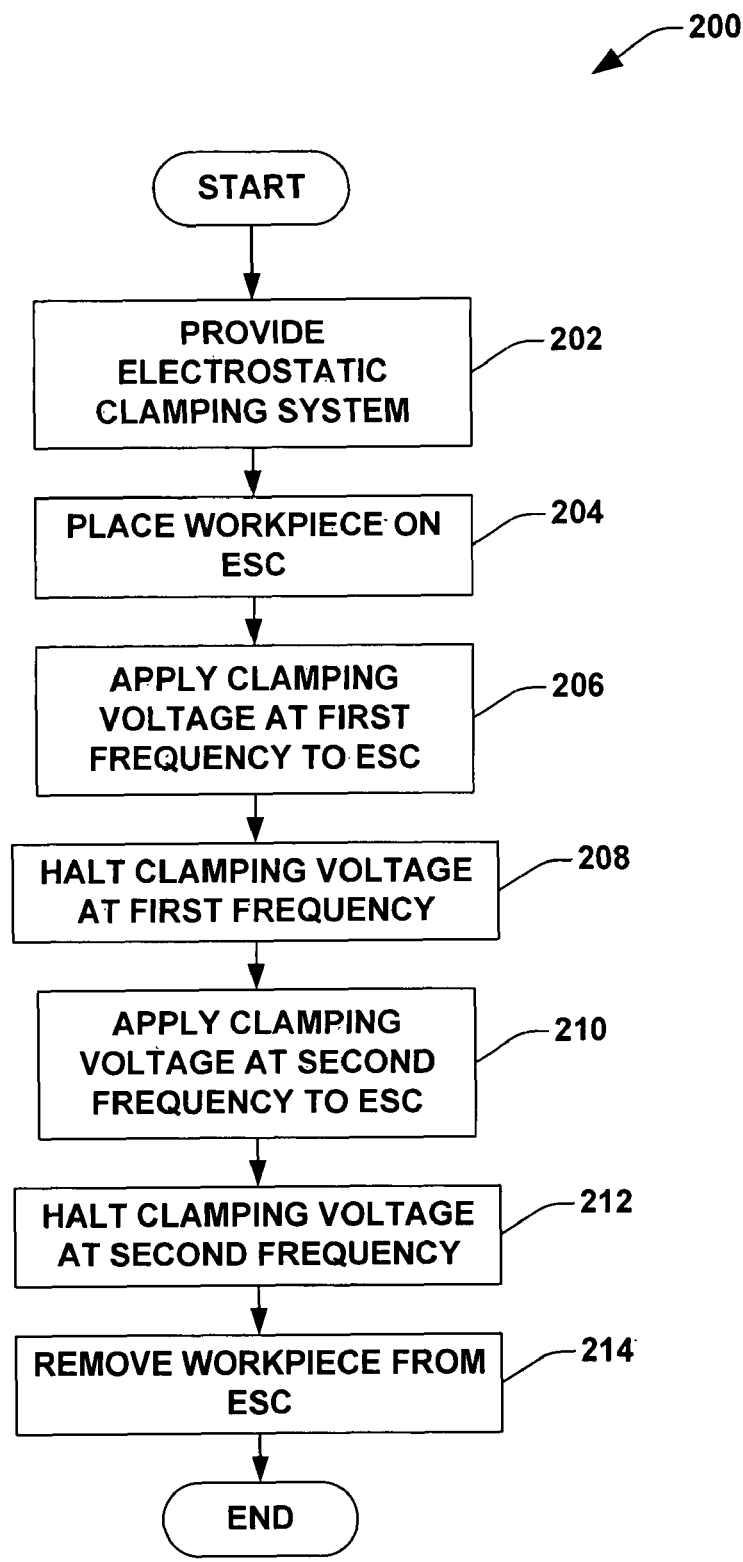
FIG. 2 is a block diagram illustrating an exemplary method for electrostatically clamping and de-clamping a workpiece with respect to an electrostatic clamp according to another exemplary aspect of the invention.

In accordance with the present invention, FIG. 2 illustrates an exemplary method 200 for optimally clamping a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 2, the method 200 begins with providing a clamping system comprising an electrostatic clamp and a power source in act 202. For example, act 202 may comprise providing the electrostatic clamping system 100 of FIG. 1. It should be noted that the electrostatic clamp provided in act 202 of FIG. 2 may comprise a Johnsen-Rahbek (J-R) clamp or a Coulombic clamp. In act 204, a workpiece is placed on a surface of the clamping plate. The workpiece, for example, may comprise a semiconductor wafer. In act 206, a first clamping voltage is applied to the electrostatic clamp at a first predetermined time. The first clamping voltage, for example, is applied via the power source 110 of FIG. 1. The application of the first clamping voltage in act 206 of FIG. 2 thus electrostatically attracts or clamps the workpiece to the clamping surface of the electrostatic clamp with a first clamping force.

In accordance with one exemplary aspect of the present invention, the first clamping voltage comprises an AC waveform having a first frequency associated-therewith. The first clamping voltage, for example, may comprise a bipolar AC square wave, a sinusoidal waveform, or various other shaped waveform. Alternatively, the first clamping voltage may comprise a DC clamping voltage, wherein the first frequency is zero hertz. The first clamping force associated with the first clamping voltage, for example, is sufficient to substantially maintain the workpiece relative to the clamping surface during a processing of the workpiece, such as in a two-dimensional translational scan of the workpiece through a process medium (e.g., an ion beam), wherein the workpiece may be subjected to substantially large G-forces at a reversal of translational direction.

In act 208, the application of the first clamping voltage at the first frequency is halted, and a second clamping voltage is applied to the electrostatic clamp. Again, the second clamping voltage may be applied by the power source 110 of FIG. 1, or it may be applied via another power source (not shown). The second clamping voltage applied in act 208 of FIG. 2 electrostatically clamps the workpiece to the electrostatic clamp with a second clamping force. The second clamping voltage, for example, comprises an AC waveform having a second frequency associated therewith, wherein the second frequency differs from the first frequency. The second clamping voltage, for example, may comprise another bipolar AC square wave, a sinusoidal waveform, or various other shaped waveform, wherein the second frequency is different that the first frequency of the first clamping voltage.

The second frequency of the second clamping voltage, for example, is selected such that the second clamping force is sufficient to substantially maintain the position of the workpiece relative to the clamping surface during a transfer of the workpiece to and/or from a process chamber associated with the process medium. The second frequency associated with the second clamping voltage is further selected such that the second frequency is greater (e.g., approximately five to ten times greater) than the first frequency, wherein a de-clamp time associated with a removal of the workpiece from the clamping plate is minimized.

As illustrated in FIG. 2, in act 212, the application of the second clamping voltage at the second frequency is halted, therein substantially halting the second clamping force between the workpiece and the electrostatic clamp. However, residual clamping forces may persist due to charge build-up in the clamping plate. The second frequency of the second clamping voltage being higher than the first frequency of the first clamping voltage, however, aids in decreasing the de-clamp time. Accordingly, following act 212, the workpiece is removed from the electrostatic clamp in act 214.

According to one example, the first clamping voltage and second clamping voltage have the same amplitude, while the first and second frequencies differ from one another. For example, the first and second frequencies of the respective first and second clamping voltages are configured such that the first clamping force generally maintains a position of the workpiece with respect to the clamping surface throughout the translation through the process medium, while the second clamping force is substantially less than the first clamping force in order to accommodate the transfer of the workpiece to and from the process chamber with a relatively short de-clamp time. The present invention further contemplates the first clamping voltage and second clamping voltage having differing amplitudes, wherein the first clamping force is greater than the second clamping force. Further, the application of the first clamping voltage at the first frequency may be halted concurrent to the translation of the workpiece through the process medium, wherein residual charges associated with the first clamping voltage continue to provide sufficient clamping of the workpiece to the electrostatic clamp. Still further, the application of the second clamping voltage at the second frequency can occur concurrent to the translation of the electrostatic clamp through the process medium.

In accordance with another exemplary aspect of the present invention, the first frequency and second frequency of the respective first clamping voltage and second clamping voltage is controlled, based, at least in part, on a set of performance criteria. The set of performance criteria, for example, comprises one or more of a desired minimum clamping force between the workpiece and the clamping plate, and a maximum de-clamp time. The desired minimum clamping force, for example, may be associated with the G-forces related to the translation of the workpiece through the process medium, as well as a minimal clamping force related to translating the workpiece to and from the process chamber.

According to yet another exemplary aspect, an additional one or more clamping voltage waveforms can be applied at an additional one or more times to the one or more electrodes of the clamping plate, therein providing an additional one or more clamping forces between the workpiece and the electrostatic clamp. It should be noted that at least two of the first clamping voltage waveform, the second clamping voltage waveform, and the one or more additional clamping voltage waveforms have differing frequencies associated therewith. For example, a high-frequency clamping voltage waveform (e.g., a first clamping voltage at a first clamping frequency) having a low clamping force can be implemented for initially clamping the workpiece, a lower-frequency clamping voltage waveform (e.g., a second clamping voltage at a second frequency) having a higher clamping force can be implemented during a translation of the workpiece (e.g., during a high G-force scanning of the workpiece through the process medium), and another higher-frequency clamping voltage waveform (e.g., a third clamping voltage at a third frequency) having a lower clamping force can be implemented again prior to the workpiece being removed from the electrostatic clamp. It will be further appreciated that any plurality of AC clamping voltage waveforms having at least two differing frequencies associated therewith can be implemented in accordance with the present invention, including, but not limited to, time-variable (i.e., ramped) waveforms, wherein a plurality of differing clamping forces can be attained throughout handling of the workpiece, and all such implementations are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for clamping and de-clamping a workpiece, the method comprising:
    providing an electrostatic clamp and a power source;
    placing the workpiece on a clamping surface of the electrostatic clamp;
    applying a clamping voltage at a first frequency to the electrostatic clamp via the power source, therein electrostatically clamping the workpiece to the electrostatic clamp with a first clamping force;
    halting the application of the clamping voltage at the first frequency and applying a second clamping voltage at a second frequency to the electrostatic clamp via the power source, wherein the second frequency is greater than the first frequency, therein electrostatically clamping the workpiece to the electrostatic clamp with a second clamping force, wherein one or more of the first frequency and second frequency of the clamping voltage are varied within a respective predetermined range during the respective application thereof;
    halting the application of the clamping voltage at the second frequency; and
    removing the workpiece from the clamping surface of the electrostatic clamp.

2. The method of claim 1, further comprising reciprocally translating the electrostatic clamp through a process medium concurrent to the application of the clamping voltage at the first frequency, wherein the first clamping force generally maintains a position of the workpiece with respect to the clamping surface throughout the reciprocal translation, and wherein the second clamping force is substantially less than the first clamping force.

3. A method for variably clamping a workpiece, the method comprising:
    providing an electrostatic clamp having a clamping plate comprising one or more electrodes and a clamping surface;
    placing the workpiece on the clamping surface of the clamping plate; and
    applying a plurality of clamping voltage waveforms at a respective plurality of times to the one or more electrodes of the clamping plate, therein providing a plurality of differing clamping forces between the workpiece and the electrostatic clamp, wherein at least two of the plurality of clamping voltage waveforms have differing frequencies associated therewith, wherein applying the plurality of clamping voltage waveforms comprises:
        applying a first clamping voltage at a first frequency to the one or more electrodes of the clamping plate, therein providing a first clamping force between the workpiece and the electrostatic clamp;
        halting the application of the first clamping voltage at the first frequency;
        applying a second clamping voltage at a second frequency to the one or more electrodes of the clamping plate, therein providing a second clamping force between the workpiece and the electrostatic clamp, wherein the second frequency is not equal to the first frequency;
        halting the application of the second clamping voltage at the second frequency;
        applying a third clamping voltage at a third frequency to the one or more electrodes of the clamping plate, therein providing a third clamping force between the workpiece and the electrostatic clamp, wherein the third frequency is not equal to at least the second frequency; and
        halting the application of the third clamping voltage at the third frequency.

4. The method of claim 3, further comprising removing the workpiece from the electrostatic clamp after the application of the third clamping voltage at the third frequency is halted.

5. The method of claim 3, wherein the first clamping frequency is greater than the second clamping frequency, and wherein the third clamping frequency is greater than the first clamping frequency.

6. The method of claim 5, further comprising:
    initially clamping the workpiece to the electrostatic clamp concurrent with the application of the first clamping voltage, wherein the first clamping force generally maintains a position of the workpiece with respect to the clamping surface of the electrostatic clamp; and
    reciprocally translating the electrostatic clamp through a process medium concurrent to the application of the second clamping voltage, wherein the second clamping force generally maintains a position of the workpiece with respect to the clamping surface throughout the reciprocal translation and is higher than the first clamping force, and wherein the third clamping force is substantially less than the first clamping force and the second clamping force.

* * * * *